United States Patent
Tsutsumi

[11] Patent Number: 5,875,414
[45] Date of Patent: Feb. 23, 1999

[54] METHOD AND APPARATUS FOR PROTECTING SWITCHING ELEMENT OF INVERTER FROM BEING OVERHEATED

[75] Inventor: Hirohiko Tsutsumi, Nagoya, Japan

[73] Assignee: Kabushiki Kaisha Meidensha, Tokyo, Japan

[21] Appl. No.: 803,509

[22] Filed: Feb. 20, 1997

[30] Foreign Application Priority Data

Feb. 21, 1996 [JP] Japan ................................. 8-033204

[51] Int. Cl.$^6$ ........................... H02M 11/00; G01K 1/12
[52] U.S. Cl. ..................... 702/99; 702/130; 395/750.01
[58] Field of Search ............................ 364/557; 318/811, 318/801, 727, 729; 363/98, 41, 131, 132, 16; 395/750.01, 750.05, 750.06, 750.07, 750.08; 702/99, 130

[56] References Cited

U.S. PATENT DOCUMENTS

| | | | |
|---|---|---|---|
| 5,248,866 | 9/1993 | Tanaka et al. | 219/10.77 |
| 5,291,607 | 3/1994 | Ristic et al. | 395/750 |
| 5,296,789 | 3/1994 | Ohi | 318/254 |
| 5,341,081 | 8/1994 | Yamada | 318/800 |
| 5,343,023 | 8/1994 | Geissler | 219/661 |
| 5,422,832 | 6/1995 | Moyal | 364/557 |
| 5,481,173 | 1/1996 | Yamamoto | 318/801 |
| 5,493,485 | 2/1996 | Okado | 363/56 |
| 5,581,452 | 12/1996 | Yamamoto | 363/41 |
| 5,610,453 | 3/1997 | Smith | 307/116 |
| 5,682,748 | 11/1997 | DeVilbiss et al. | 62/3.7 |
| 5,700,996 | 12/1997 | Lee et al. | 219/626 |
| 5,712,540 | 1/1998 | Toda et al. | 318/46 |

FOREIGN PATENT DOCUMENTS 7-255166  10/1995  Japan .

OTHER PUBLICATIONS

The Transactions of The Institute of Electrical Engineers of Japan vol. 111–D, No. 9, Sep. 1991, pp. 740–751 (No translation).

Primary Examiner—John Barlow
Assistant Examiner—Patrick Assovad
Attorney, Agent, or Firm—Foley & Lardner

[57] ABSTRACT

In a method and apparatus for protecting a plurality of same semiconductor switching elements used in a PWM inverter from being overheated, a junction temperature rise $T_n$ of one of the switching elements is derived on the basis of an output frequency of the inverter ($\omega$ c), an output current (I) of the inverter, and a control factor (a) and when $T_n > T_{nref}$, the overheat in the corresponding switching element occurs so that a gate signal for each switching element is not inputted or an PWM off duty ratio on a pulse duty ratio of the gate signal is increased to limit the output current of the inverter.

6 Claims, 5 Drawing Sheets

METHOD AND APPARATUS FOR PROTECTING SWITCHING ELEMENT OF INVERTER FROM BEING OVERHEATED

BACKGROUND OF THE INVENTION

The present invention relates to apparatus and method for protecting switching elements used in an inverter from being overheated applicable to a vector control system for an induction motor.

In a case where an induction motor is driven by means of the inverter, either one of upper or lower positioned switching element in one arm of the inverter is conducted (turned on). In a low frequency driving of the motor, the duration of time during which either of the upper or lower positioned switching element is relatively long, so that a temperature ripple in an internal junction of the one of the switching elements becomes large. In detail, as an output frequency of the inverter becomes low, the element internal junction temperature becomes higher if a total loss of the one of the switching elements remains unchanged.

FIGS. 5A and 5B show change patterns of the output current of the inverter and the temperature ripple of the switching element junction temperature during a normal driving (relatively high frequency driving) of the induction motor.

FIG. 5C and 5D show change patterns of the output current of the inverter and the temperature ripple of the switching element junction temperature during the low frequency driving of the same motor where an effective value of the output current is equal to the case of FIG. 5A.

As shown in FIGS. 5A to 5D, the junction temperature of the switching element becomes high during the on state of the switching element and becomes low during the off state thereof. That is to say, the temperature rise and drop are repeated for each of a half period of the output frequency. The difference between the maximum temperature and the minimum temperature is called the temperature ripple. In the case of the low frequency driving as shown in FIG. 5B, the duration of time during which the one of the switching elements is conducted (turned on) or turned off becomes long so that the temperature ripple becomes large.

Japanese Patent Application First Publication No. Heisei 7-255166 published on Oct. 3, 1995 exemplifies a method for protecting power switching elements used in an inverter.

In the disclosed power switching element protecting method, an output current of the inverter to a load (induction motor) is detected by means of a current detector to protect the switching elements from being overheated and a controller for the inverter is installed in which an on-and-off control for each of the switching elements is carried out so that the output current does not exceed a predetermined current value.

For example, a time limit characteristic of each switching element used for controlling the on-and-off of the switching elements is such that as time passes, the output current (load current) becomes lower. That is to say, each of the switching elements is protected from being overheated by providing a limit for the magnitude of the output current of the inverter and the duration of the output current flow.

However, since only the magnitude of the output current and a casing temperature of the one of the switching element are detected and read in the above-described Japanese Patent Application Publication, it is not sufficient for each of the switching elements to be protected from being overheated in such a low frequency, a large current driving situation as described above.

SUMMARY OF THE INVENTION

It is an object of the present invention to provide an improved method and apparatus for protecting a plurality of same switching elements in an inverter from being overheated especially during low frequency driving.

According to one aspect of the present invention, there is provided a method for protecting a plurality of same semiconductor switching elements used in an inverter from being overheated, comprising the steps of:

a) detecting an output current of said inverter;
b) reading the output current, an output voltage phase θ of the inverter, an output frequency of the inverter, and a control factor a;
c) deriving a switching element junction temperature rise in one of the switching elements on the basis of the read output current, the output voltage phase θ, output frequency, and the control factor a:
d) determining whether the switching element temperature rise is in excess of a predetermined limit value above which the corresponding one of the switching elements is overheated; and
e) reducing an on pulse duty ratio of a gate signal supplied to each switching element so as to limit the output current of the inverter.

According to another aspect of the present invention, there is provided an apparatus for protecting a plurality of same semiconductor switching elements used in an inverter from being overheated, comprising:

a sensor arranged for detecting an output current of said inverter; and,
an inverter PWM controller arranged for reading the output current of the inverter, an output voltage phase θ of the inverter, an output frequency of the inverter, and a control factor a, deriving a switching element junction temperature rise on the basis of the read output current, the output voltage phase θ, the output frequency, and the control factor a, determining whether the switching element temperature rise is in excess of a predetermined limit value above which a corresponding one of the switching elements is overheated, and reducing an on duty of a pulse duty ratio of a gate signal supplied to each switching element so as to limit the output current of the inverter.

BRIEF DESCRIPTION OF THE DRAWINGS

FIGS. 5A, 5B, 5C, and 5D show waveform charts of output currents and temperature ripple during a normal driving and a low frequency driving described in the

BACKGROUND OF THE INVENTION

BEST MODE FOR CARRYING OUT THE INVENTION

Reference will hereinafter be made to the drawings in order to facilitate a better understanding of the present invention.

Figure 1:
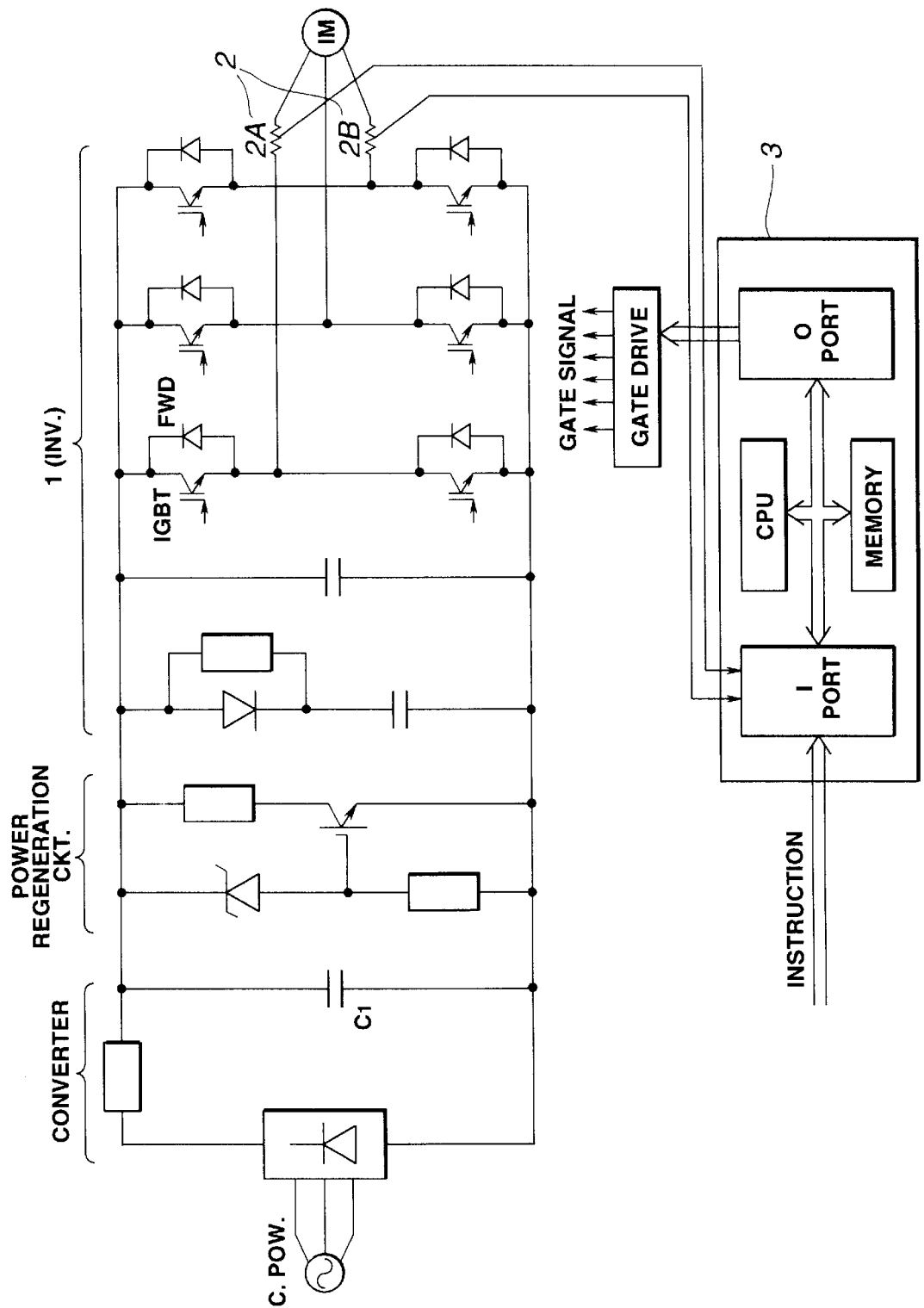
FIG. 1 is a circuit block diagram of an example of an apparatus for controlling a three-phase induction motor through a PWM inverter to which a method for protecting a plurality of switching elements in an inverter from being overheated according to the present invention is applicable.

FIG. 1 shows a circuit block diagram of a general purpose inverter for a three-phase induction motor (IM) to which a first preferred embodiment of a method for protecting a plurality of switching elements used in the inverter from being overheated according to the present invention is applicable.

As shown in FIG. 1, a reference numeral 1 denotes an inverter section of a three-arm bridge circuit type, each arm having two serially connected switching elements of IGBT (Insulated Gate Bipolar Transistor). Each IGBT has a collector end, an emitter end, and a gate end. The collector end of each IGBT is connected to a cathode end of a fly wheel diode (FWD) and the emitter end thereof is connected to an anode end of the FWD.

A junction point of each arm between upper IGBT and lower IGBT is connected to a load such as the induction motor (IM). It is noted that a current detector (generally current transformer) 2A is inserted in a three phase voltage line (Vu) and another current detector 2B is inserted in another three phase voltage line (Vw).

A commercial AC power supply is connected to a converter (AC-DC converter), to a power regeneration circuit, and the inverter. It is noted that, in the case of a vector control system for the induction motor (AC servo), a pulse encoder (PP) is attached to a rotor of the induction motor to detect a speed of the rotor of the motor (IM) and the output pulse of the pulse encoder (PP) is sent to a PWM controller 3 to calculate a slip frequency and so on. The vector control system described above is exemplified by a U.S. Pat. No. 5,341,081, the disclosure of which is herein incorporated by reference.

A gate drive (circuit) is interposed between the controller 3 and each gate end of the IGBTs of the inverter section 1. The (sinusoidal wave) PWM inverter 3 includes: an Input Port receiving an instruction, for example, a torque instruction and a detected output of the current detector 2 (2A, 2B); a CPU (Central Processing Unit); a memory; an Output Port connected to the gate drive; and a common bus.

Anyway, it is necessary to reduce the power loss in order to suppress the temperature rise of the IGBT element since the temperature rise in the IGBT element is caused by the power loss in the IGBT element. This can apply equally well to another semiconductor switching element.

A duty ratio variation of the PWM signal to the first arm upper and lower IGBT elements and the connected FWD can be expresses as follows:

IGBT element;

$$\Delta Q_1/\Delta\theta = \tfrac{1}{2}(1 + a\sin\theta) \quad (1),$$

$$\Delta Q_4/\Delta\theta = \tfrac{1}{2}(1 - a\sin\theta) \quad (2),$$

It is noted that the PWM duty ratio variation in the FWD section is the same as the equation (2).

In the equations (1) and (2), $\Delta Q_1$ denotes a turn on time interval of a first-arm upper switching element of IGBT, $\Delta\theta$ denotes an angle of a period of triangular wave which is a carrier wave frequency for the PWM inverter 1, $\Delta Q_4$ denotes a turn on interval of the first-arm lower switching element of IGBT, "a" to denotes a control factor (or modulation rate), and $\theta$ denotes an output voltage phase of the inverter 1.

Next, the power loss of the first arm upper IGBT switching element and that of the first-arm FWD switching element are expressed as follows:

$$P_T = P_{TON} + P_{TSW} \quad (3)$$
$$= V_{ce(sat)}(@I) \cdot I \cdot (1 + a\sin\theta)/2 + P_{TSW},$$
$$(\because P_{TSW} = \omega_c A_q/2\pi^2 \cdot I_m + \omega c B_q/8\pi \cdot I_m),$$

wherein $I_m$ denotes a maximum value of the output current (Iu, or Iw), $\omega$ c denotes the carrier wave frequency, $A_q$ and $B_q$ denote loss coefficients (switching loss parameters that the corresponding switching element inherently has), Vce(sat)(@I) denotes a collector-emitter voltage at a saturation region when the output current of I flows, $P_T$ denotes the power loss at the IGBT section, and $P_{TON}$ denotes a steady state loss of the IGBT section.

(first arm upper) FWD section;

$$P_D = V_F(@I) \cdot I \cdot (1 - a\sin\theta)/2 \quad (4)$$

wherein $P_D$ denotes the loss of the IGBT section and $V_F(@I)$ denotes a forward voltage drop at the FWD section when the output current of I flows.

It is noted that the equations (1) to (4) are described in a Japanese Paper (transactions) of "Dengakuron D" (Electrical Engineering Institute) (T. IEE) of Japan, Volume III, No. 9 (pages 741 to 750), published in 1991 (titled Improvement of Short Current Suppression and Power Loss Evaluations for PWM inverter).

Hence, variables (factors) to determine the power losses include switching element characteristics, output current I, control factor a, and output voltage phase $\theta$ (an output frequency corresponding to the carrier wave frequency $\omega$ c inclusive).

Figure 3:
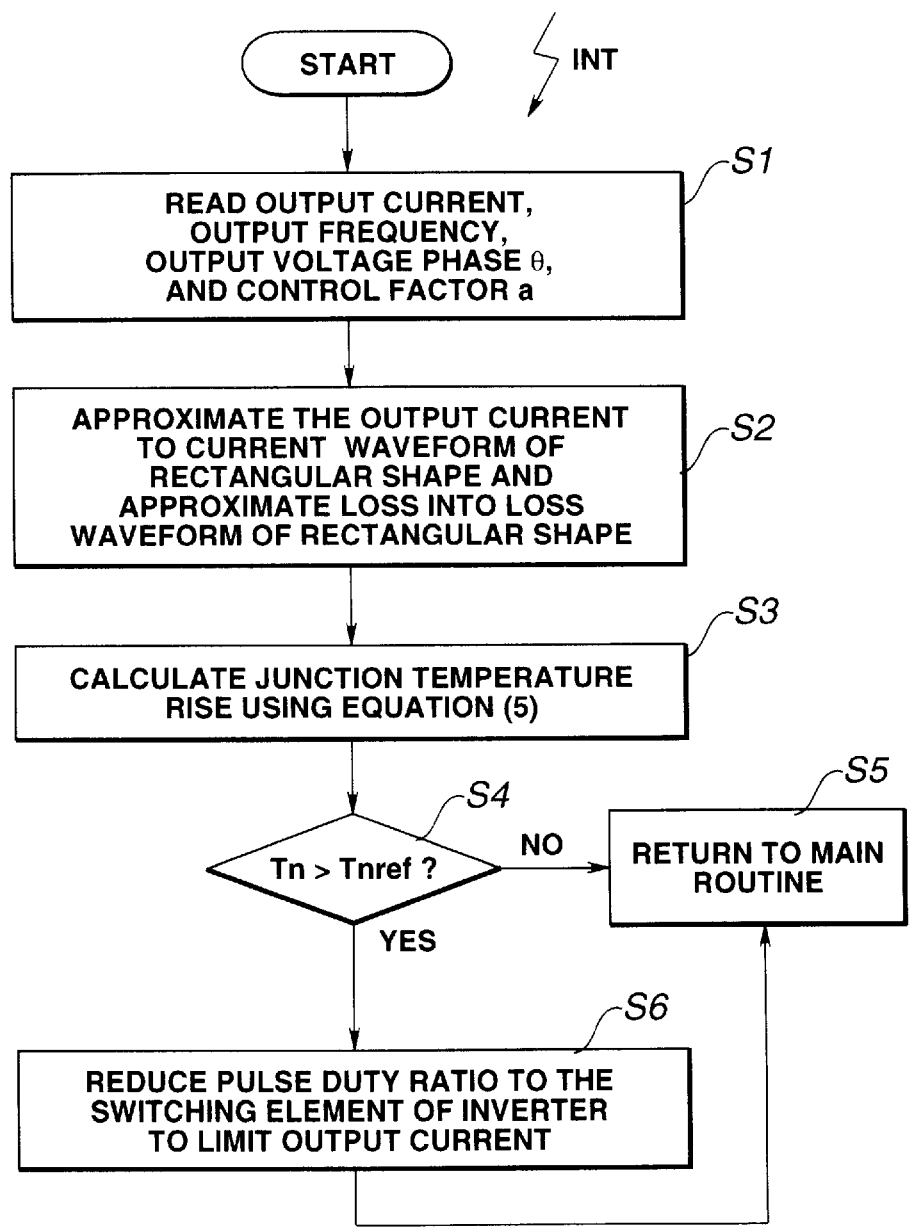
FIG. 3 is an operational flowchart for explaining an execution of a first preferred embodiment of the method in a controller shown in FIG. 1.

Referring to FIG. 3, the CPU of the PWM controller 1 reads the output current (I"), the output frequency $\omega$ c, the output voltage phase $\theta$, and the control factor a at a step S1. It is noted that the parameters of the output frequency (fc or $\omega$ c), the output voltage phase $\theta$, and the control factor a except the output current I are read from the memory since the controller 1 calculates these parameters to control the driving of the induction motor. These calculations are exemplified by U.S. Pat. No. 5,581,452, No. 5,341,081, and No. 5,481,173 (the disclosures of which are herein incorporated by reference).

Figure 2A:
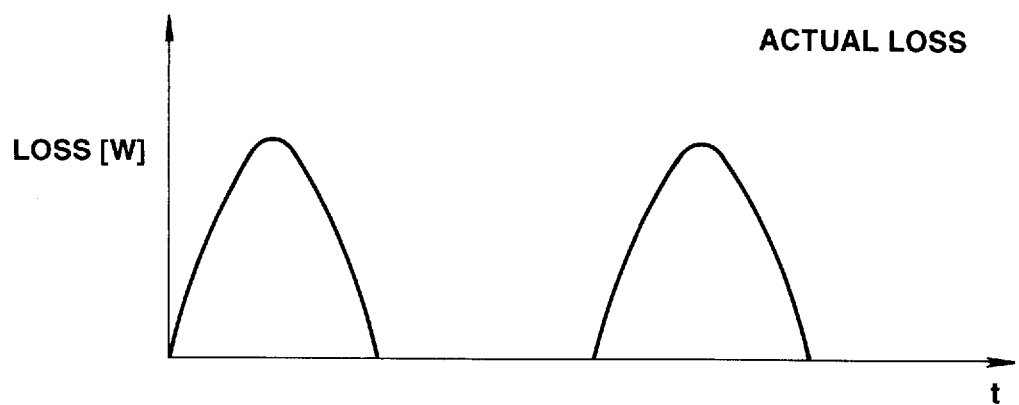
FIGS. 2A and 2B are explanatory timing charts of an actual (power) loss (FIG. 2A) in one of the switching elements (IGBT and FWD in FIG. 1) and discrete rectangular waveform (FIG. 2B) of the loss in FIG. 2A.
Figure 2B:
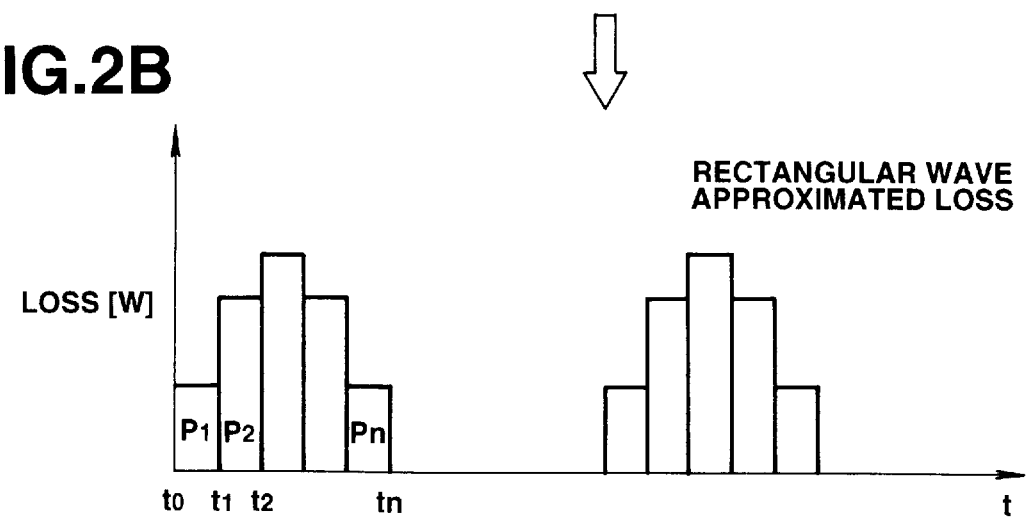

At the next step S2, the CPU calculates the power loss of the IGBT element and connected FWD element using the equations (1) through (4) and calculates the rise in temperature of the IGBT element and connected FWD element (for example, the first arm upper IGBT element and the connected FWD element). In this embodiment, the power losses are approximated from the half sinusoidal form shown in FIG. 2A into a rectangular shape shown in FIG. 2B.

That is to say, each of the power losses in the half sinusoidal form is in a discrete digital form at times $t_0$, $t_1$, $t_2$, - - -, $t_i$, - - -, $t_n$. Each power loss is calculated as $P_0$, $P_1$, $P_2$, - - -, $P_i$, - - -, $P_n$.

Then, a transient thermal impedance previously stored into a memory location in the memory of the PWM controller 1 is read and to calculate the temperature rise of the IGBT element (and the connected FWD element) using the following equation (5).

$$T_n = \sum_{i=1}^{n} Pi\{Z_{th}(t_n - t_{i-1}) - Z_{th}(t_n - t_i)\}, \quad (5)$$

wherein $Z_{th}$ denotes the transient thermal impedance [° C./W].

Hence, the element junction temperature rise in the switching element is affected by the loss and duration of time during which the loss occurs.

It is noted that the transient thermal impedance of the switching element is already determined and stored in a memory location of the memory according to a thermal resistance curve that the switching element inherently has with the period ($T_p$) of the carrier wave frequency for the inverter 1 as a variable.

For example, suppose that the carrier wave frequency ω c (fc) is 10 KHz (Tp=100 μS).

① t; 0~10 msec: $\Delta Z_{th}(i)=Z_{th}(t_n-t_{i-1})-Z_{th}(t_n-t_i)=0.837[(T_p xi)^{0.473}-\{T_p x(i-1)^{0.473}\}](°C./W.)$ ② t; 10.1 msec ~100 msec: $\Delta Z_{th}(i)=Z_{th}(t_n-t_{i-1})-Z_{th}(t_n-t_i)=0.606[(T_p xi)^{0.402}-\{T_p x(i-1)^{0.402}\}](°C./W.)$ ③ t;100.1 msec ~100 msec: $\Delta Z_{th}(i)=Z_{th}(t_n-t_{i-1})-Z_{th}(t_n-t_i)=0.319[(T_p xi)^{0.123}-\{T_p x(i-1)^{0.123}\}](°C./W.)$ ④ t;800 msec or more $Z_{th}(i)=0(°C./W)$. It is noted that the value of time t ① to ④ can be selected from the value of (Tp x i). It is noted that the above-described parameters in the transient thermal impedance are derived using the IGBT switching element of product No. MBB100AS6.

Next, at a step S4, the CPU determines whether $T_n>T_{nref}$. $T_{nref}$ denotes a predetermined limit value (either of nominal values of the junction temperatures in the IGBT switching element or connected FWD element) above which the corresponding switching element is overheated.

That is to say, $T_n$ is derived according to the switching element used in the inverter 1. If the switching element in the first upper arm position is constituted by the IGBT and the FWD, $T_n$ is for the IGBT switching element. If the switching element in the first upper arm position is constituted by only the IGBT element, $T_n$ is derived without calculation of the equation (2).

If $T_n>T_{nref}$ at the step S4, the routine goes to a step S6 in which the drive signals to the respective gates of the IGBT elements are omitted or the duty ratio of each drive signal is reduced (off ratio is increased). If $T_n \leq T_{nref}$ (No at the step S4), the routine goes to the step S5 in which the routine is returned to a main routine.

Consequently, the overheat in the switching element can accurately be prevented from occurring.

Especially, the overheat which is easy to occur during the low frequency driving can accurately be prevented since the output frequency of the PWM inverter 1 is taken into consideration. It is noted that the first arm upper positioned IGBT element is taken into consideration since the same switching element is attached onto the other arm positions of the three arm inverter 1.

(Second Embodiment)

Figure 4:
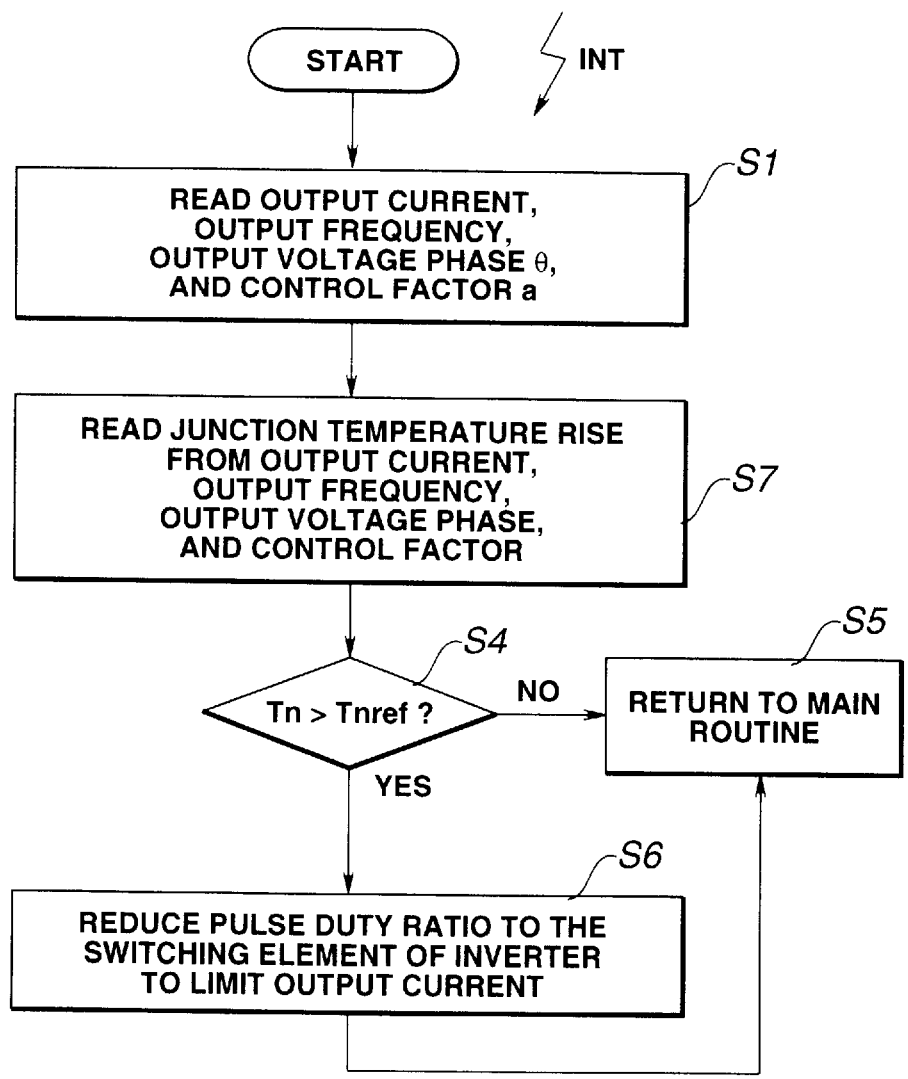
FIG. 4 is an operational flowchart for explaining an execution of a second preferred embodiment of the method in the controller shown in FIG. 1.
Figure 5A:
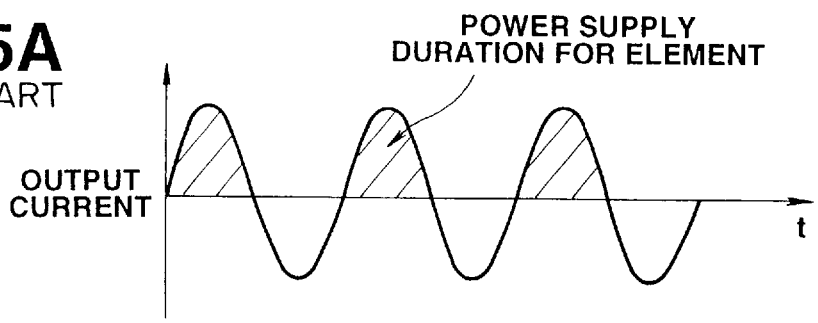
Figure 5B:
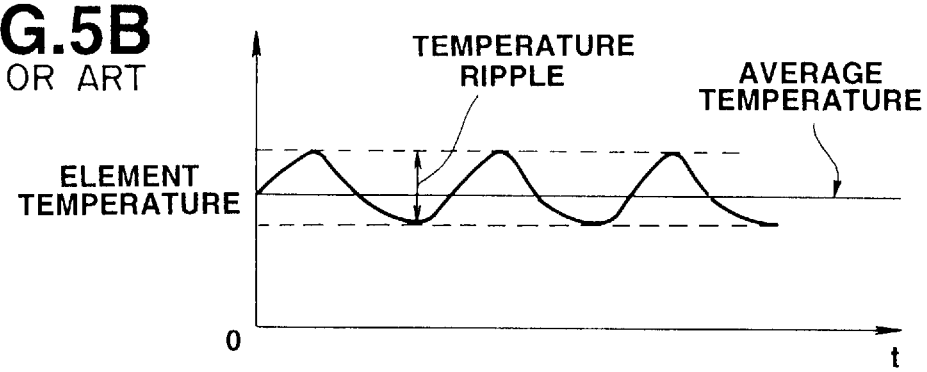
Figure 5C:
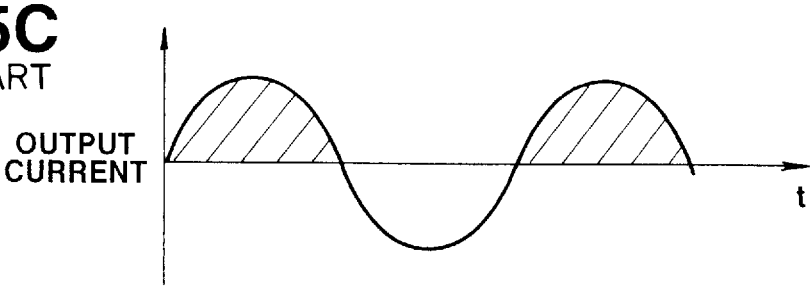
Figure 5D:
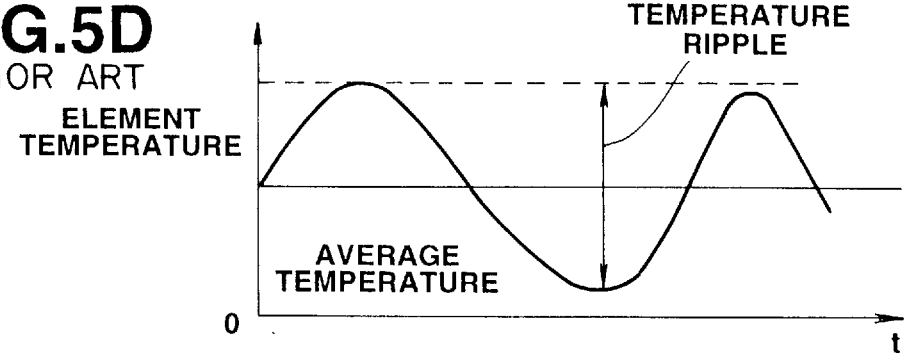

FIG. 4 is an operational flowchart for explaining a second preferred embodiment according to the present invention.

In the second embodiment, the CPU of the inverter 1 already stores the data on the junction temperature rise $T_n$ determined with the output frequency ω c, the output voltage phase θ, and the control factor a as variables into memory locations of the memory in the PWM controller 1.

Then, during the actual driving of the load as the induction motor (IM), the CPU reads the present variables described above at the step S1 and retrieves one of the element junction temperature rise data from the memory locations of the memory at a step S7.

Thus, the burden of the CPU of the PWM controller 1 to calculate the equations described above during the driving for the induction motor can be relieved.

It is noted that although FIGS. 3 and 4 are executed whenever a predetermined period of time has passed as an interrupt routine, another execution method may be carried out to determine whether the overheat of the switching element occurs using the variables described above (and the equations (3) and (5) (the use of the equation (4) is dependent on whether the FWD elements are used)).

Furthermore, the present invention is applicable to the inverter having the switching elements of power MOS (Metal Oxide Semiconductor), GTR (Gate Turn Off Thyristor), or other semiconductor switching elements.

What is claimed is:

1. A method for protecting a plurality of same semiconductor switching elements used in an inverter from being overheated, comprising the steps of:

a) detecting an output current of said inverter;

b) reading the output current, an output voltage phase θ of the inverter, an output frequency of the inverter, and a control factor a;

c) deriving a switching element junction temperature rise in one of the switching elements on the basis of the read output current, the output voltage phase θ, output frequency, and the control factor a;

d) determining whether the switching element temperature rise is in excess of a predetermined limit value above which the corresponding one of the switching elements is overheated; and e) reducing an on pulse duty ratio of a gate signal supplied to each switching element so as to limit the output current of the inverter.

2. A method for protecting a plurality of same semiconductor switching elements used in an inverter from being overheated as claimed in claim 1, which further comprises the steps of:

f) storing a steady state ON loss of the corresponding one switching element, a switching loss thereof, a transient thermal impedance thereof, and a switching loss calculation formula into each corresponding one of memory locations of a memory of a controller;

g) calculating a loss of each switching element from the read output current of the inverter, output voltage phase, the control factor, the stored steady state ON loss, and the stored switching loss using the stored switching loss calculation formula; and h) calculating the switching element junction temperature rise using the stored transient thermal impedance and the calculated switching loss.

3. A method for protecting a plurality of same semiconductor switching elements used in an inverter from being overheated as claimed in claim 1, wherein said step c) comprises the steps of: f) storing a plurality of data on the switching element junction temperature rise with the output current, the output voltage phase, the output frequency, and the control factor as variables; and g) retrieving one of the data from the stored data according to the detected output current detected at the step a) and the read output voltage phase, output frequency, and control factor read at the step b).

4. A method for protecting a plurality of same semiconductor switching elements used in an inverter from being overheated as claimed in claim 2, wherein each of said switching elements is constituted by an IGBT and a fly wheel diode (FWD) connected across the IGBT, and wherein an three phase induction motor is connected to the inverter.

5. A method for protecting a plurality of same semiconductor switching elements used in an inverter from being overheated as claimed in claim 4, wherein the detected output current of the inverter is approximated into a rectangular waveform, the switching loss of each switching element is approximated into another rectangular waveform, and the switching element junction temperature rise Tn at a time of $t_n$ is calculated as $$T_n = \sum_{i=1}^{n} Pi\{Zth(tn - ti - 1) - Z_{th}(t_n - t_i)\},$$

wherein $t=t_0, \cdots, t_i, \cdots, t_n$, $Z_{th}$ denotes the transient thermal impedance.

6. An apparatus for protecting a plurality of same semiconductor switching elements used in an inverter from being overheated, comprising:

a sensor arranged for detecting an output current of said inverter; and, an inverter PWM controller arranged for reading the output current of the inverter, an output voltage phase θ of the inverter, an output frequency of the inverter, and a control factor a, deriving a switching element junction temperature rise on the basis of the read output current, the output voltage phase θ, the output frequency, and the control factor a, determining whether the switching element temperature rise is in excess of a predetermined limit value above which a corresponding one of the switching elements is overheated, and reducing an on duty of a pulse duty ratio of a gate signal supplied to each switching element so as to limit the output current of the inverter.

* * * * *